(12) United States Patent
Parks

(10) Patent No.: US 8,493,066 B2
(45) Date of Patent: Jul. 23, 2013

(54) MAGNETIC FIELD DETECTION USING FARADAY EFFECT

(75) Inventor: Allen D. Parks, Spotsylvania, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 310 days.

(21) Appl. No.: 13/134,486

(22) Filed: Jun. 6, 2011

(65) Prior Publication Data

US 2012/0313634 A1     Dec. 13, 2012

(51) Int. Cl.
*G01R 33/02* (2006.01)
(52) U.S. Cl.
USPC ........................................ 324/244.1; 324/244
(58) Field of Classification Search
USPC ..................................................... 324/244.1
See application file for complete search history.

(56) References Cited

U.S. PATENT DOCUMENTS

| | | | | |
|---|---|---|---|---|
| 4,952,014 | A | * | 8/1990 | Lieberman et al. ......... 324/244.1 |
| 5,008,622 | A | | 4/1991 | Overton, Jr. et al. .......... 324/248 |
| 5,109,196 | A | | 4/1992 | Wikswo, Jr. et al. ......... 324/263 |
| 6,885,192 | B2 | | 4/2005 | Clarke et al. .................. 324/300 |
| 7,193,413 | B2 | | 3/2007 | Kandori et al. ............... 324/244 |
| 2004/0041082 | A1 | * | 3/2004 | Harmon .................... 250/214 R |

OTHER PUBLICATIONS

Pustelny, et al., Magnetometry based on nonlinear magneto-optical rotation with amplitude-modulated light, J. App. Phys., V. 103, No. 6, 2008. p. 1-7.*

(Continued)

*Primary Examiner* — Thomas Valone

(74) *Attorney, Agent, or Firm* — Gerhard W. Thielman, Esq

(57) ABSTRACT

A magnetometer is provided for detecting a magnetic field of strength B using the Faraday effect. The magnetometer includes a photon emitter, a first polarizer, a prism, a second polarizer, a detector and an analyzer. The emitter projects an emitted light beam substantially parallel to the magnetic field and having wavelength $\lambda$. The prism has an interface surface and is composed of a Faraday medium having Verdet value V. The emitted light beam passes through the first polarizer and then the prism, exiting from the interface surface making an incident angle $\theta_0$ to normal of the surface and then refracting into a secondary medium as first and second circularly polarized light beams that are separated by a small angular divergence $\delta$. These polarized light beams have average refraction angle $\theta$ to the normal and pass through a post-selection polarizer before the detector measures a weak value $A_w$ of a photon having "which path" operator $\hat{A}$ associated with the polarized light beams. The magnetic field strength is determined as $$B \approx -\frac{2\varepsilon A_w \pi n_0 \cos\theta}{V\lambda \sin\theta_0}.$$

The parameters include $n_0$ as index of refraction of the secondary medium, and $\varepsilon$ as amplification factor. The pointer rotation angle $A_w$ can be expressed as $$A_w = \frac{(\theta_+ - \theta_-)\cos\varepsilon + [(\theta_+ + \theta_-) - 2\theta_0]\sin\varepsilon}{2\sin\varepsilon}$$

in which $\theta_+$ and $\theta_-$ are respectively right- and left-polarized refraction angles with the average refraction angle such that $$\theta = \frac{1}{2}(\theta_+ + \theta_-).$$

The pointer rotation angle $A_w$ can be approximated as $A_w \approx \delta/2\varepsilon$ when $0<\varepsilon<<1$. A method is provided incorporating operations described for the magnetometer.

6 Claims, 1 Drawing Sheet

OTHER PUBLICATIONS

A. Ghosh et al., "Observation of the Faraday effect via beam deflection in a longitudinal magnetic field", *Phys. Rev. A* 76, 055402 (2007) http://arxiv.org/PS_cache/physics/pdf/0702/0702063v1.pdf.

I. M. Duck et al., "The sense in which a 'weak measurement' of a spin-½ particle's spin component yields a value 100" *Phys. Rev. D* 40, 2112-17 (1989) http://prd.aps.org/pdf/PRD/v40/i6/p2112_1.

A. Messiah, *Quantum Mechanics*, v. 2, pp. 1068-1071 (1961).

* cited by examiner

MAGNETIC FIELD DETECTION USING FARADAY EFFECT

STATEMENT OF GOVERNMENT INTEREST

The invention described was made in the performance of official duties by one or more employees of the Department of the Navy, and thus, the invention herein may be manufactured, used or licensed by or for the Government of the United States of America for governmental purposes without the payment of any royalties thereon or therefor.

BACKGROUND

The invention relates generally to magnetic field detection. In particular, this invention relates to quantum enhanced magnetometry for detecting feeble longitudinal magnetic fields using weak value amplification of a Faraday Effect.

Detecting the presence of feeble background or fluctuating magnetic fields can become necessary for various operations, such as for metal detection. However, conventional devices and processes exhibit deficiencies in cost and/or portability.

SUMMARY

Conventional magnetometers yield disadvantages addressed by various exemplary embodiments of the present invention. Various exemplary embodiments provide a magnetometer for detecting a magnetic field of strength B by using the Faraday effect. The magnetometer includes a photon emitter, a first polarizer, a prism, a second polarizer, a detector and an analyzer. The emitter projects an emitted light beam substantially parallel to the magnetic field and having wavelength $\lambda$. The prism has an interface surface and is composed of a Faraday medium having Verdet value V.

In various exemplary embodiments, the emitted light beam passes through the first polarizer and then the prism, exiting from the interface surface making an incident angle $\theta_0$ to normal of the surface and then refracting into a secondary medium as first and second circularly polarized light beams separated by a small angular divergence $\delta$. These polarized light beams have average refraction angle $\theta$ to the normal and pass through a post-selection polarizer before the detector measures the pointer rotation angle $A_w$ associated with the polarized light beams. The magnetic field strength is determined as $$B \approx -\frac{2\varepsilon A_w \pi n_0 \cos\theta}{V\lambda \sin\theta_0}.$$

The parameters include $n_0$ as index of refraction of the secondary medium, and $\varepsilon$ as amplification factor.

For sufficiently small $\varepsilon$, the pointer rotation angle $A_w$ can be approximated as $A_w \approx \delta/2\varepsilon$ and corresponds to amplification of the small divergence angle $\delta$. The analyzer determines $A_w$ as the mean value of the light intensity distribution profile produced by the detector. Various exemplary embodiments also provide a method that incorporates operations described for the magnetometer.

BRIEF DESCRIPTION OF THE DRAWINGS

These and various other features and aspects of various exemplary embodiments will be readily understood with reference to the following detailed description taken in conjunction with the accompanying drawings, in which like or similar numbers are used throughout, and in which.

DETAILED DESCRIPTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

In accordance with a presently preferred embodiment of the present invention, the components, process steps, and/or data structures may be implemented using various types of operating systems, computing platforms, computer programs, and/or general purpose machines. In addition, those of ordinary skill in the art will readily recognize that devices of a less general purpose nature, such as hardwired devices, or the like, may also be used without departing from the scope and spirit of the inventive concepts disclosed herewith. General purpose machines include devices that execute instruction code. A hardwired device may constitute an application specific integrated circuit (ASIC) or a floating point gate array (FPGA) or other related component.

This disclosure provides an overview of how weak value amplification can be used to detect and measure the strength of feeble longitudinal magnetic fields. Such measurements can be made using either classically intense laser light or single photon streams. The disclosure describes how a combined application of a recently discovered Faraday effect and weak value amplification can be used to detect and measure feeble longitudinal magnetic fields. The methodology has potential utility in such areas as detecting metallic objects, determining spatial orientation of magnetic fields, non-intrusive early warning of electrical machine failure, and measuring Verdet constants of Faraday materials.

A longitudinal magnetic field induces a circular differential refraction of a linearly polarized photon beam at the boundary between a Faraday medium and a medium with negligible Verdet constant as reported by A. Ghosh et al., "Observation of the Faraday effect . . . " in *Phys. Rev. A* 76, 055402 (2007). See either http://www.rowland.harvard.edu/rjf/fischer/images/PRA_76_055402.pdf or else http://arxiv.org/PS_cache/physics/pdf/0702/0702063v1.pdf for details.

This differential refraction is independent of the photon's pathlength through the Faraday medium and occurs within a few wavelengths of the boundary. The Verdet constant V represents an optical parameter that describes the strength of Faraday rotation from interaction between light and a magnetic field for a particular material, named for French physicist Émile Verdet.

Figure 1:
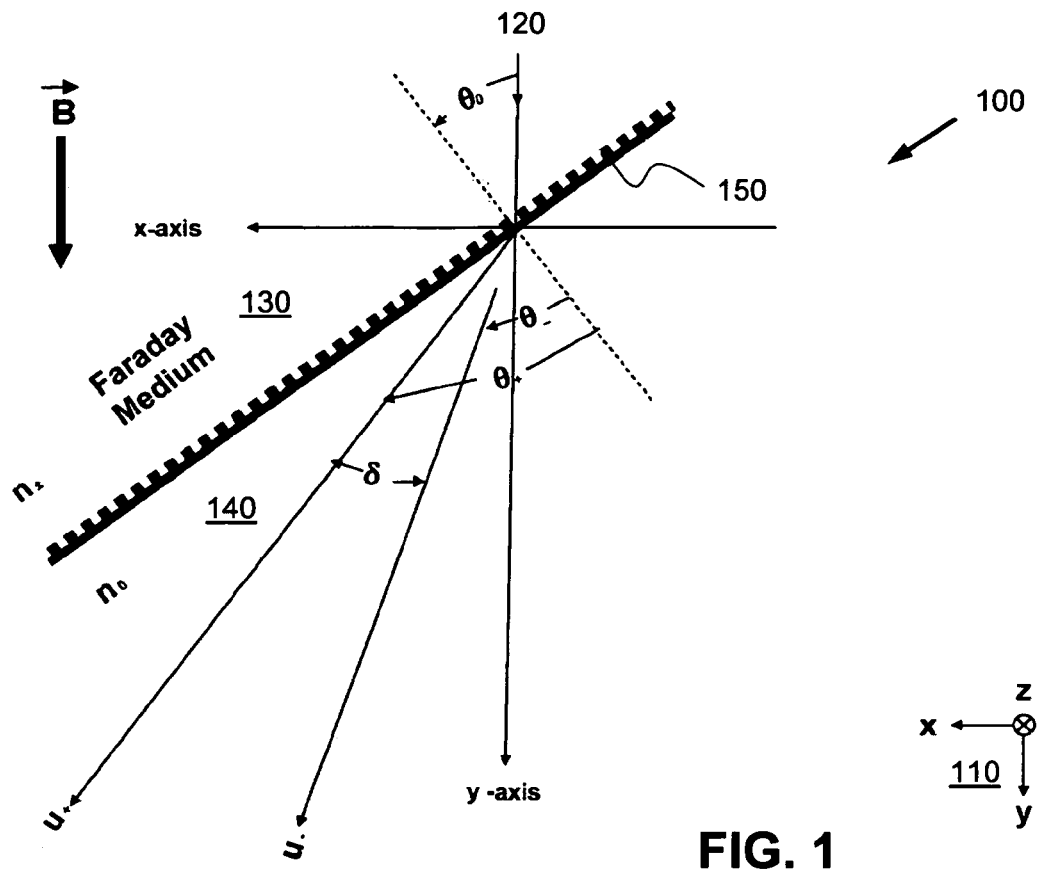
FIG. 1 is a diagram view of a diagram of optical paths.

FIG. 1 depicts an optical diagram 100 with accompanying coordinate reference frame 110 for a monochromatic linearly polarized coherent laser beam 120 of wavelength $\lambda$. The beam 120 forms either a classically intense continuum or a stream of single photons that is incident from a Faraday medium 130 to a secondary medium 140 of negligible Verdet constant separated by an interface boundary 150. The Faraday and secondary media 130 and 140 have respective indices of refraction $n_\pm$ and $n_0$. The subscripts plus (+) and minus (−) respectively correspond to right and left circular polarized radiation. The diagram 100 illustrates the paths taken by the light beam 120 at the interface between the Faraday medium 130 and the secondary medium 140 with negligible Verdet constant.

The beam 120 has an angle of incidence of $\theta_0$ from the normal to the interface 150. In the presence of a longitudinal magnetic field $\vec{B}$ (having strength B), the beam 120 refracts at angles $\theta_\pm$ from normal at the interface 150 into two circularly polarized beams having an angular divergence $\delta=\theta_+-\theta_-$ can be approximated as:

$$\delta \approx -\frac{\lambda \sin\theta_0}{\pi n_0 \cos\theta} VB, \tag{1}$$

where angle $$\theta = \frac{1}{2}(\theta_+ + \theta_-)$$

is the average of $\theta_+$ and $\theta_-$, which are respectively the right- and left-circularized refraction angles, and V is the Verdet constant for the Faraday medium 130.

As shown, the incident beam's direction of propagation determines the y-axis of the reference frame 110. The x-axis is in the plane containing the beam 120 and normal to the interface at the point of incidence. The origin of the reference frame 110 is defined by the perpendicular intersection of the x-axis with the y-axis at the interface 150. The usual z-axis with positive direction $\hat{z}=\hat{x}\times\hat{y}$ completes the reference frame 110.

The longitudinal magnetic field $\vec{B}$ is assumed to be present and parallel to the positive y-axis. If the photon distribution of the incident beam 120 has a Gaussian distribution symmetric about the positive y-axis with mean value at x=0, then the refracted beams exhibit Gaussian distributions that are symmetric about their refracted paths which are along the vectors $\vec{u}_\pm$ in the x-y plane of the reference frame 110. More specifically, the refracted beams exhibit photon distribution mean values which are rotationally displaced around the z-axis through distinct angles $\theta_\pm-\theta_0$ from the positive y-axis in the direction of vectors $\vec{u}_\pm$ in the x-y plane, respectively.

This refraction process can be described from a quantum mechanical measurement perspective using the mean value of the intensity distribution profile produced by a detector as a measurement pointer. This description maintains validity for both a single photon stream and a classically intense beam.

In particular, an Hermitean operator $\hat{A}$ can be constructed and used to form a Hamiltonian operator $\hat{H}$ that describes a photon-interface interaction which produces the required geometry of the refraction process. Let $|+\rangle$ and $|-\rangle$ be the right and left circular polarization eigenstates, respectively, of the photon circular polarization operator $\hat{\sigma}$ which obey the eigenvalue equation:

$$\hat{\sigma}|\pm\rangle = \pm|\pm\rangle \tag{2}$$

and have the orthogonality properties:

$$\langle\pm|\pm\rangle = 1 \text{ and } \langle\pm|\mp\rangle = 0. \tag{3}$$

One can define the "which path" operator $\hat{A}$ as:

$$\hat{A} \equiv (\theta_+-\theta_0)|+\rangle\langle+| + (\theta_--\theta_0)|-\rangle\langle-| \tag{4}$$

and the associated interaction Hamiltonian $\hat{H}$ to be expressed as:

$$\hat{H}=\hat{A}\hat{J}_z\delta(t-t_0). \tag{5}$$

Here the Dirac delta function $\delta(t-t_0)$ encodes the fact that the refraction occurs within a few wavelengths of the interface 150 by modeling the refraction effectively as an impulsive interaction between a photon of the beam 120 and the interface 150 at time $t_0$. The "which path" operator $\hat{A}$ accounts for the refractive angular displacements of the initial photon beam 120 at the interface 150. The operator $\hat{J}_z$ constitutes the measurement pointer's z-component of angular momentum, and couples the refractive angular displacements to the measurement pointer. One can note that:

$$[\hat{A},\hat{J}_z]=0, \tag{6}$$

and that $|\pm\rangle$ are eigenstates of $\hat{A}$ with respective eigenvalues $(\theta_\pm-\theta_0)$.

Figure 2:
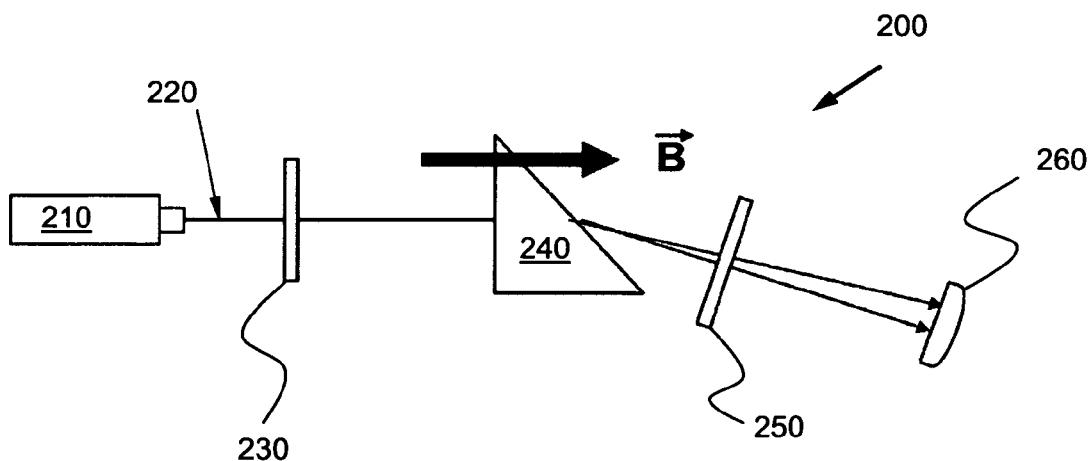
FIG. 2 is a schematic view of an exemplary magnetometer.

FIG. 2 shows an elevation schematic 200 of a magnetometer that employs this angular divergence. A laser 210 emits a photon beam 220 as analogous to the beam 120. The beam 220 passes through a pre-selection polarization filter 230 to reach a Faraday medium 240 (in the form of a prism), analogous to the medium 130. The refracted beams pass through a post-selection polarization filter 250 to reach a detector 260 that measures intensity distribution of the refracted polarized light beams.

For an initial photon polarization state $|\psi_i\rangle$, i.e., the pre-selected state, and an initial (Gaussian) pointer state $|\phi\rangle$, the initial state of the combined pre-selected system and measurement pointer prior to the interaction at the interface 150 at time $t_0$ constitutes the tensor product state $|\psi_i\rangle|\phi\rangle$. Note that the beam 220 has passed through the pre-selection filter 230 prior to its entry into the Faraday medium 240.

Immediately following the measurement's impulsive interaction at the interface 150, the combined system is in the state:

$$|\Psi\rangle = e^{-\frac{i}{\hbar}\int \hat{H}dt}|\psi_i\rangle|\varphi\rangle = e^{-\frac{i}{\hbar}\hat{A}\hat{J}_z}|\psi_i\rangle|\varphi\rangle, \tag{7}$$

where use has been made of the fact that the integral of the delta function is:

$$\int \delta(t-t_0)dt=1. \tag{8}$$

Now let the initial predicted polarization state be expressed as:

$$|\psi_i\rangle = a|+\rangle + b|-\rangle, \tag{9}$$

in which a and b are complex numbers that satisfy the condition $\langle\psi_i|\psi_i\rangle=1$, and rewrite eqn. (7) as:

$$|\Psi\rangle = e^{-\frac{i}{\hbar}\hat{A}\hat{J}_z}(a|+\rangle + b|-\rangle)|\varphi\rangle. \tag{10}$$

Because the $n^{th}$ power of the "which path" operator $\hat{A}$ has the sum:

$$\hat{A}^n = (\theta_+-\theta_0)^n|+\rangle\langle+| + (\theta_--\theta_0)^n|-\rangle\langle-|, n=0,1,2,\ldots, \tag{11}$$

then the exponential interaction operator can be written as:

$$e^{-\frac{i}{\hbar}\hat{A}\hat{J}_z} = \sum_{n=0}^{\infty} \frac{\left[-\frac{i}{\hbar}\hat{A}\hat{J}_z\right]^n}{n!} \qquad (12)$$

$$= \sum_{n=0}^{\infty} \frac{\left[-\frac{i}{\hbar}(\theta_+ - \theta_-)\hat{J}_z\right]^n}{n!}|+\rangle\langle+| +$$

$$\sum_{n=0}^{\infty} \frac{\left[-\frac{i}{\hbar}(\theta_- - \theta_0)\hat{J}_z\right]^n}{n!}|-\rangle\langle-|$$

$$= e^{-\frac{i}{\hbar}(\theta_+ - \theta_0)\hat{J}_z}|+\rangle\langle+| + e^{-\frac{i}{\hbar}(\theta_- - \theta_0)\hat{J}_z}|-\rangle\langle-|,$$

where $i=\sqrt{-1}$ is the imaginary unit and $$\hbar = \frac{h}{2\pi}$$

represents the reduced Planck constant. This result correlates refraction angle rotations with polarization.

The exponential operators constitute the rotation operators $\hat{R}_z$:

$$e^{-\frac{i}{\hbar}(\theta_\pm - \theta_0)\hat{J}_z} = \hat{R}_z(\theta_\pm - \theta_0) \equiv \hat{R}_z^\pm. \qquad (13)$$

These operators rotate the x- and y-axes through angles ($\theta_\pm - \theta_0$) around the z-axis of the reference frame 110. The rotation notation is consistent with the convention used by A. Messiah, *Quantum Mechanics*, v. 2, p. 1068 (1961).

This enables the system state in the $\{|\vec{r}\rangle\}$ representation to be rewritten as:

$$\langle\vec{r}|\Psi\rangle = a|+\rangle\langle\vec{r}|\hat{R}_z^+|\phi\rangle + b|-\rangle\langle\vec{r}|\hat{R}_z^-|\phi\rangle \qquad (14)$$

The associated pointer state distribution in the $\{|\vec{r}\rangle\}$-representation is then:

$$|\langle\vec{r}|\Psi\rangle|^2 = |a|^2|\langle\vec{r}|\hat{R}_z^+|\phi\rangle|^2 + |b|^2|\langle\vec{r}|\hat{R}_z^-|\phi\rangle|^2, \qquad (15)$$

and clearly corresponds to a sum of two Gaussian distributions $|\langle\vec{r}|\hat{R}_z^\pm|\phi\rangle|^2$ which are each symmetrically distributed about the vectors $\vec{u}_\pm$, respectively.

A final photon polarization state $|\psi_f\rangle$ that is post-selected can be expressed as:

$$|\psi_f\rangle = c|+\rangle + d|-\rangle \qquad (16)$$

in which c and d represent complex numbers that satisfy the condition $\langle\psi_f|\psi_f\rangle=1$. Note that the post-selection filter 250 receives the beam after refraction by the Faraday medium 240. From this, the resulting pointer state becomes:

$$|\Phi\rangle = \langle\psi_f|\Psi\rangle = ac^*\hat{R}_z^+|\phi\rangle + bd^*\hat{R}_z^-|\phi\rangle \qquad (17)$$

in which the asterisk denotes the complex conjugate, and its $\{|\vec{r}\rangle\}$-representation distribution is:

$$|\langle\vec{r}|\Phi\rangle|^2 = |ac^*|^2|\langle\vec{r}|\hat{R}_z^+|\phi\rangle|^2 + |bd^*|^2|\langle\vec{r}|\hat{R}_z^-|\phi\rangle|^2$$

$$+ 2\text{Re}\,ac^*b^*d\langle\vec{r}|\hat{R}_z^+|\phi\rangle\langle\vec{r}|\hat{R}_z^-|\phi\rangle^*. \qquad (18)$$

One may observe that although eqn. (18) constitutes a sum of two Gaussian distributions that are symmetrically distributed around vector $\bar{u}_\pm$, unlike eqn. (15), this distribution also contains an interference term. Careful manipulation of this interference term can be described herein that produces the desired amplification effect.

In contrast to a strong measurement, a weak measurement of the "which path" operator $\hat{A}$ occurs when the uncertainty $\Delta\theta$ in the pointer's rotation angle is much greater than the separation between $\hat{A}$'s eigenvalues, and when the interaction between a photon and the pointer is sufficiently weak so that the system remains essentially undisturbed by that interaction. In this case, the post-selected pointer state is represented as:

$$|\Phi\rangle = \qquad (19)$$

$$\langle\psi_f|e^{-\frac{i}{\hbar}\hat{A}\hat{J}_z}|\psi_i\rangle|\varphi\rangle \approx \langle\psi_f|\left(1 - \frac{i}{\hbar}\hat{A}\hat{J}_z\right)|\psi_i\rangle|\varphi\rangle \approx \langle\psi_f|\psi_i\rangle e^{-\frac{i}{\hbar}A_w\hat{J}_z}|\varphi\rangle,$$

or else as:

$$\langle\vec{r}|\Phi\rangle \approx \langle\psi_f|\psi_i\rangle\langle\vec{r}|\hat{R}_z(\text{Re}\hat{A}_w)|\phi\rangle \qquad (20)$$

where the quantity $A_w$ is expressed as:

$$A_w = \frac{\langle\psi_f|\hat{A}|\psi_i\rangle}{\langle\psi_f|\psi_i\rangle} \qquad (21)$$

and constitutes the weak value of operator $\hat{A}$. Note that quantity $A_w$ has generally a complex value that can be directly calculated from the associated theory. One may also note that in response to $|\psi_i\rangle$ and $|\psi_f\rangle$ being nearly orthogonal, the real value $\text{Re}A_w$ can lie far outside the spectrum of eigenvalues for $\hat{A}$.

The pointer state distribution for eqn. (20) is:

$$|\langle\vec{r}|\Phi\rangle|^2 \approx |\langle\psi_f|\psi_i\rangle|^2|\langle\vec{r}|\hat{R}_z(\text{Re}\hat{A}_w)|\phi\rangle|^2, \qquad (22)$$

and corresponds to a broad distribution that is symmetric around a vector in the x-y plane. That vector can be determined by a rotation of the x- and y-axes through an angle $\text{Re}A_w$ about the z-axis. In order that eqn. (20) be valid, both of the two following general weakness conditions for the uncertainty in the pointer rotator angle must be satisfied:

$$(a)\Delta\theta \gg |A_w| \text{ and } (b)\Delta\theta \gg \left\{\min_{(n=2,3,\ldots)}\left|\frac{A_w}{(A^n)_w}\right|^{\frac{1}{n-1}}\right\}^{-1}, \qquad (23)$$

as reported by I. M. Duck et al., "The sense in which a 'weak measurement' of a spin-1/2 particle's spin component yields a value 100" in *Phys. Rev. D* 40, 2112-17 (1989). See http://prd.aps.org/pdf/PRD/v40/i6/p2112_1 for details.

Use of the above pre- and post-selected states $|\psi_i\rangle$ and $|\psi_f\rangle$—along with eqn. (11)—provides the following scalar expression for the weak value of the $n^{th}$ moment of the "which path" operator $\hat{A}$:

$$(A^n)_w = \frac{ac^*(\theta_+ - \theta_0)^n + bd^*(\theta_- - \theta_0)^n}{ac^* + bd^*}, \qquad (24)$$

where c* and d* represent complex conjugates of c and d.

When n=1, then the first moment corresponds to the rotation angle of the pointer's peak intensity. The first moment is:

$$A_w = \frac{ac^*(\theta_+ - \theta_0) + bd^*(\theta_- - \theta_0)}{ac^* + bd^*}. \quad (25)$$

When the transmission axis of the pre-selection polarizer 230 is set so that:

$$a = \sin\phi, \text{ and } b = \cos\phi, \quad (26)$$

and that of the post-selection polarizer 250 is set so that:

$$c = \cos\chi, \text{ and } d = -\sin\chi, \quad (27)$$

then the quantity $A_w$ becomes:

$$A_w = \text{Re} A_w = \frac{(\theta_+ - \theta_0)\sin\phi\cos\chi - (\theta_- - \theta_0)\cos\phi\sin\chi}{\sin(\phi - \chi)}. \quad (28)$$

One can observe from this that the absolute value of the "which path" scalar $|A_w|$ can be made arbitrarily large by choosing $\phi \approx \chi$, i.e., separated by a small difference term $\epsilon$. In particular, let $\chi = \phi - \epsilon$ and $\phi = \pi/4$ (in which case the pre-selected state is linearly polarized in the x-direction). Consequently, $$(a) \sin\phi = \cos\phi = \sqrt{2}/2, \quad (29)$$
$$(b) \cos\chi = \frac{\sqrt{2}}{2}(\cos\epsilon + \sin\epsilon),$$
$$(c) \sin\chi = \frac{\sqrt{2}}{2}(\cos\epsilon - \sin\epsilon), \text{ and}$$
$$(d) \sin(\phi - \chi) = \sin\epsilon.$$

The previous relation from eqn. (28) for the amplified pointer rotation angle associated with the post-selected circularly polarized beams then becomes:

$$A_w = \frac{(\theta_+ - \theta_0)(\cos\epsilon - \sin\epsilon) - (\theta_- - \theta_0)(\cos\epsilon - \sin\epsilon)}{2\sin\epsilon}, \quad (30)$$

which can be rewritten (by simplifying grouped terms) alternatively as:

$$A_w = \frac{(\theta_+ - \theta_-)\cos\epsilon + [(\theta_+ + \theta_-) - 2\theta_0]\sin\epsilon}{2\sin\epsilon}. \quad (31)$$

This quantity as the pointer rotation angle can be conveniently related to the angular divergence $\delta$ and the difference term $\epsilon$ as:

$$A_w = \frac{\delta}{2\tan\epsilon} + (\theta - \theta_0). \quad (32)$$

Note that for small difference such that:

$$0 < \epsilon \ll 1, \quad (33)$$

then the rotation angle becomes arbitrarily large in magnitude and can be approximated as:

$$A_w \approx \frac{\delta}{2\epsilon}, \quad (34)$$

and because of this, $\epsilon$ can be called the amplification factor.

The weakness condition constraint follows when eqns. (24) and (25) can be used to obtain the associated weakness condition when incorporating $0 < \epsilon \ll 1$ from eqn. (33) into inequalities eqn. (23), along with selections for a, b, c, d, $\phi$, $\chi$. These steps yield:

$$(a) \Delta\theta \gg \frac{|\delta|}{2\epsilon} \text{ and} \quad (35)$$
$$(b) \Delta\theta \gg 2|\theta - \theta_0|.$$

Here use is made of the fact that for $0 < \epsilon \ll 1$ being sufficiently small, then:

$$\min_{(n=2,3,\ldots)} \left|\frac{A_w}{(A^n)}\right|^{\frac{1}{n-1}} \approx \min_{(n=2,3,\ldots)} \left|\frac{(\theta_+ - \theta_0) - (\theta_- - \theta_0)}{(\theta_+ - \theta_0)^n - (\theta_- - \theta_0)^n}\right|^{\frac{1}{n-1}} \quad (36)$$
$$= \left|\frac{(\theta_+ - \theta_0) - (\theta_- - \theta_0)}{(\theta_+ - \theta_0)^2 - (\theta_- - \theta_0)^2}\right|$$
$$= |(\theta_+ - \theta_0) - (\theta_- - \theta_0)|^{-1} = (2|\theta - \theta_0|)^{-1}.$$

Satisfaction of both conditions (a) and (b) of eqn. (35) requires that when $0 < \epsilon \ll 1$ from eqn. (33), then the uncertainty $\Delta\theta$ greatly exceeds the absolute ratio value:

$$\Delta\theta \gg \left|\frac{\delta}{2\epsilon}\right|. \quad (37)$$

This condition can be satisfied by making the initial Gaussian pointer distribution width sufficiently large.

Thus, as per eqns. (22) and (34), the rotation of the initial photon distribution axis of symmetry provides an amplified measurement of the angular divergence $\delta$ via the weak value of the "which path" operator $\hat{A}$. For a known amplification $\epsilon$ and a measured mean value of the intensity distribution profile produced by the detector 260 corresponding to $A_w$, then angular divergence $\delta$ can be estimated from eqn. (34) as:

$$\delta \approx 2\epsilon A_w. \quad (38)$$

The real component of the complex operator $A_w = \text{Re} A_w$ corresponds to the angle between the direction of the resultant photon distribution peak and the positive y-axis is measured. Using eqn. (38) in eqn. (1) provides:

$$B \approx -\frac{2\epsilon\pi n_0 A_w \cos\theta}{V\lambda\sin\theta_0}, \quad (39)$$

as the measured magnetic field strength when there is sufficient knowledge of the value of the other parameters (e.g., $\theta$, $n_0$, V, etc.) appearing on the right hand side of this expression.

Of special potential interest is the utility of this process for detecting very small changes $\Delta B$ in ambient longitudinal magnetic fields. If:

$$\frac{\delta_0}{2\epsilon} \approx A_{w,0} \quad (40)$$

represents the amplified angular divergence associated with an ambient field $B_0$, and also eqn. (38):

$$\frac{\delta}{2\epsilon} \approx A_w \quad (41)$$

expresses the amplified angular divergence induced by the new changed field:

$$B = B_0 + \Delta B, \quad (42)$$

for fixed $\epsilon$, then for fixed $\lambda$, $\theta_0$, V, and $n_0$ the signal for the presence of $\Delta B$ is an observed change expressed as:

$$A_w - A_{w,0} \neq 0 \quad (43)$$

in the pointer rotator angle.

This change in pointer rotation angle $A_w$ is related to a corresponding change in the amplified divergence angle according to $$\frac{\Delta \delta}{2\epsilon} = \frac{\delta - \delta_0}{2\epsilon} \approx A_w - A_{w,0}. \quad (44)$$

When one assumes that $\Delta B$ is small and produces a negligible change in $\cos \theta$, then:

$$A_w - A_{w,0} \approx -\frac{\lambda \sin\theta_0}{2\epsilon\pi n_0 \cos\theta} V \Delta B, \quad (45)$$

from which the magnetic field change $\Delta B$ can be approximated as:

$$\Delta B \approx -\frac{2\epsilon (A_w - A_{w,0})\pi n_0 \cos\theta}{V\lambda \sin\theta_0}. \quad (46)$$

As a first numerical example, let the Faraday medium 130 be water, which has a Verdet constant V=0.0131 arc min·Gauss$^{-1}$·cm$^{-1}$, and the medium 140 with negligible Verdet constant be air (V~$10^{-6}$ arc min·Gauss$^{-1}$·cm$^{-1}$; $n_0$=1). Assume that wavelength is $\lambda$=578 nm (yellow light); that the ratio $$\frac{\sin\theta_0}{\cos\theta} \sim 1;$$

and the background magnetic field is negligible, i.e., $B_0$=0. Then re-expressing the eqn. (45) in the more familiar units of arcsec-Tesla$^{-1}$ (in which 1.0 Tesla=1.0×$10^4$ Gauss) yields:

$$A_w - A_{w,0} \approx -7.23 \times 10^{-2} \frac{\Delta B}{\epsilon} \text{arcsec} \cdot Tesla^{-1}. \quad (47)$$

If amplitude $\epsilon=10^{-6}$, then $$A_w - A_{w,0} \approx -7.23 \times 10^4 \Delta B \text{ arc sec·Tesla}^{-1}, \quad (48)$$

so that magnetic field deviation of $\Delta B=10^{-4}$ Tesla=1 Gauss induces a change in pointer rotator angle of approximately −7.23 arc sec, provided that the uncertainty in rotation angle exceeds this threshold value, i.e., $\Delta\theta \gg 7.23$ arc sec.

In order to compare the sensitivity enhancement of the exemplary magnetometer with that of Ghosh's experimental apparatus, one can use a magnetometer that uses a light beam 220 with wavelength $\lambda$=532 nm and SF11 Schott (dense flint) glass as the Faraday medium 240, with Verdet constant being V~30.44 Tesla·rad$^{-1}$·m$^{-1}$). For this, the pointer rotation angles $A_w$ register as $\delta/2\epsilon$, where $\delta\epsilon \sim [0.5 \times 10^{-6}$ rad, $3.1 \times 10^{-6}$ rad] constitutes the range of Ghosh's experimentally measured angular divergences induced by field strengths $B\epsilon \sim$ [0.25 Tesla, 1.2 Tesla].

Thus, for a measured pointer range in rotation angle $A_w$ equal to the $\delta$ range, this magnetometer with a post-selection polarizer amplifies angular divergences in the range $\delta\epsilon \sim$ [$1.0\epsilon \times 10^{-6}$ rad, $6.2\epsilon \times 10^{-6}$ rad]. This therefore enables detection of longitudinal field strengths equal to $2\epsilon$ times the magnetic field strengths used in Ghosh's experiment.

For example, if $\epsilon=10^{-4}$, then this exemplary magnetometer amplifies angular divergences in the range $\delta\epsilon \sim [1.0 \times 10^{-10}$ rad, $6.2 \times 10^{-10}$ rad] and thus detects field strengths in the range $B\epsilon \sim [0.5 \times 10^{-6}$ Tesla, $2.4 \times 10^{-6}$ Tesla]—provided that the angular rotation uncertainty satisfies $\Delta\theta \gg 3.1 \times 10^{-6}$ rad. Clearly, in an operational version of such a magnetometer, one would prefer a Faraday medium 240, laser wavelength, and $\theta_0$ combination that would produce a divergence $\delta$ as large as possible.

Further, one may observe that a magnetometer such as this could be used to detect electric currents which produce feeble magnetic fields, perform non-intrusive diagnostics on electrical machinery, as well as determine the spatial orientation of magnetic fields. In addition, the temporal behavior of magnetic fields could also be accurately measured and it may be possible to couple such a magnetometer to a (Kalman) filter in order to provide precision control of varying magnetic fields.

Thus, the technique provides for detection of a weak longitudinal magnetic field by the Faraday effect on a light beam. The technique employs this effect by the apparatus and method presented herein, and improves such sensitivity detection over conventional techniques by improved amplification of the divergence angle between the refracted circularly polarized light beams.

While certain features of the embodiments of the invention have been illustrated as described herein, many modifications, substitutions, changes and equivalents will now occur to those skilled in the art. It is, therefore, to be understood that the appended claims are intended to cover all such modifications and changes as fall within the true spirit of the embodiments.

What is claimed is:

1. A magnetometer for detecting a magnetic field of strength B, said magnetometer comprising:
    a photon emitter for projecting an emitted light beam substantially parallel to the magnetic field and having wavelength $\lambda$;
    a first polarizer for pre-selecting said emitted light beam as a pre-selection beam;
    a prism composed of a Faraday medium having Verdet value V through which said pre-selection beam passes and exits from an interface surface at incident angle $\theta_0$ to normal of said surface into a secondary medium as first and second circularly polarized light beams having average refraction angle $\theta$ to said normal and angular divergence $\delta$;
    a second polarizer for post-selecting said emerging circularly polarized light beams as a post-selection beam;
    a detector for measuring an intensity distribution profile associated with said post-selection beam; and
    an analyzer for determining mean value of said intensity distribution profile as $A_w$ produced by said detector, and the magnetic field strength as $$B \approx -\frac{2\epsilon A_w \pi n_0 \cos\theta}{V\lambda \sin\theta_0}$$

in which $n_0$ is index of refraction of said secondary medium, and $\epsilon$ being amplification factor.

2. The magnetometer according to claim 1, wherein said prism is disposed within a background medium having negligible Verdet value.

3. The magnetometer according to claim 1, wherein said distribution profile is $$A_w = \frac{(\theta_+ - \theta_-)\cos\varepsilon + [(\theta_+ + \theta_-) - 2\theta_0]\sin\varepsilon}{2\sin\varepsilon}.$$

in which $\theta_+$ and $\theta_-$ are respectively right- and left-polarized refraction angles with said average refraction angle such that $$\theta = \frac{1}{2}(\theta_+ + \theta_-),$$

and angular divergence such that $\delta = \theta_+ - \theta_-$.

4. A method for detecting a magnetic field of strength B, said method comprising:
  projecting an emitted light beam substantially parallel to the magnetic field and having wavelength $\lambda$;
  pre-selecting a first polarization state of said emitted light beam as a pre-selection beam;
  refracting said pre-selection beam by a prism composed of a Faraday medium having Verdet value V through which said pre-selection beam passes and exits from an interface surface at incident angle $\theta_0$ to normal of said surface into a secondary medium as first and second circularly polarized light beams having average refraction angle $\theta$ to said normal;
  post-selecting a second polarization state of said polarized light beams as post-selected beams;
  measuring pointer rotator angle $A_w$ associated with said post-selected beams; and
  determining the magnetic field strength as $$B \approx -\frac{2\varepsilon A_w \pi n_0 \cos\theta}{V\lambda \sin\theta_0}$$

in which $n_0$ is index of refraction of said secondary medium, $\varepsilon$ is amplification factor, and $A_w$ is said measured pointer rotation angle between circularly polarized beams.

5. The method according to claim 4, further comprising disposing said prism within a background medium having negligible Verdet value.

6. The method according to claim 4, wherein said pointer rotation angle is $$A_w = \frac{(\theta_+ - \theta_-)\cos\varepsilon + [(\theta_+ + \theta_-) - 2\theta_0]\sin\varepsilon}{2\sin\varepsilon}$$

in which $\theta_+$ and $\theta_-$ are respectively right- and left-polarized refraction angles with said average refraction angle such that $$\theta = \frac{1}{2}(\theta_+ + \theta_-).$$

* * * * *